US009407066B2

(12) United States Patent
Cheng et al.

(10) Patent No.: US 9,407,066 B2
(45) Date of Patent: Aug. 2, 2016

(54) III-V LASERS WITH INTEGRATED SILICON PHOTONIC CIRCUITS

(71) Applicant: GLOBALFOUNDRIES INC., Grand Cayman (KY)

(72) Inventors: Cheng-Wei Cheng, White Plains, NY (US); Frank R. Libsch, White Plains, NY (US); Tak H. Ning, Yorktown Heights, NY (US); Uzma Rana, Chappaqua, NY (US); Kuen-Ting Shiu, White Plains, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 232 days.

(21) Appl. No.: 13/949,973

(22) Filed: Jul. 24, 2013

(65) Prior Publication Data

US 2015/0030047 A1    Jan. 29, 2015

(51) Int. Cl.
*H01L 21/00* (2006.01)
*H01S 5/00* (2006.01)
*H01S 5/227* (2006.01)
(Continued)

(52) U.S. Cl.
CPC .............. *H01S 5/2275* (2013.01); *H01S 5/166* (2013.01); *H01S 5/021* (2013.01); *H01S 5/1017* (2013.01); *H01S 5/1057* (2013.01)

(58) Field of Classification Search
CPC ......... H01S 5/026; H01S 5/0268; H01S 5/12; H01S 5/1231; H01S 5/125; H01S 5/0202; H01S 5/0201; H01L 33/0079; H01L 27/1214; H01L 51/56; H01L 27/12; H01L 33/0095; H01L 27/153; H01L 21/3086; H01L 33/10; H01L 33/105; H01L 33/30; H01L 33/46; H01L 33/465; B82Y 10/00; B82Y 20/00; G02B 6/136; G02F 1/136227
USPC .................................. 438/29, 30, 31, 34, 42
See application file for complete search history.

(56) References Cited

U.S. PATENT DOCUMENTS

| 4,940,672 A   | 7/1990 | Zavracky |
| 5,493,577 A * | 2/1996 | Choquette et al. ....... 372/46.013 |

(Continued)

FOREIGN PATENT DOCUMENTS

| EP | 2523026 A1    | 11/2012 |
| WO | WO2009146461 A1 | 12/2009 |

(Continued)

OTHER PUBLICATIONS

Coldren, L. "Multi-Function Integrated INP-Based Photonic Circuits" 34th European Conference on Optical Communication, ECOC 2008. Sep. 2008. (1 Page).

(Continued)

*Primary Examiner* — Jessica Stultz
*Assistant Examiner* — Delma R Forde
(74) *Attorney, Agent, or Firm* — Michael Le Strange; Hoffman Warnick LLC

(57) ABSTRACT

III-V lasers integrated with silicon photonic circuits and methods for making the same include a three-layer semiconductor stack formed from III-V semiconductors on a substrate, where a middle layer has a lower bandgap than a top layer and a bottom layer; a mirror region monolithically formed at a first end of the stack, configured to reflect emitted light in the direction of the stack; and a waveguide region monolithically formed at a second end of the stack, configured to transmit emitted light.

13 Claims, 9 Drawing Sheets

(51) Int. Cl.
*H01S 5/16* (2006.01)
*H01S 5/02* (2006.01)
*H01S 5/10* (2006.01)

(56) References Cited

U.S. PATENT DOCUMENTS

| | | |
|---|---|---|
| 7,588,954 B2 | 9/2009 | Von Kaenel et al. |
| 7,596,158 B2 | 9/2009 | Liu et al. |
| 2006/0198404 A1* | 9/2006 | Henrichs .................... 372/29.02 |
| 2011/0222570 A1 | 9/2011 | Junesand et al. |
| 2012/0288971 A1 | 11/2012 | Bogaerts et al. |
| 2013/0062665 A1 | 3/2013 | Kunert |
| 2015/0008465 A1* | 1/2015 | Nayver et al. ................... 257/98 |

FOREIGN PATENT DOCUMENTS

| | | |
|---|---|---|
| WO | WO2012136176 A1 | 10/2012 |
| WO | WO2013026858 A1 | 2/2013 |

OTHER PUBLICATIONS

Fehly, D., et al. "Monolithic INGAASP Optoelectronic Devices With Silicon Electronics" IEEE Journal of Quantum Electronics, vol. 37, No. 10. Oct. 2001. pp. 1246-1252.

Kunert, B., et al. "Advances in the Growth of Lattice-Matched III-V Compounds on SI for Optoelectronics" IPRM—22nd international Conference on Indium Phosphide and Related Materials. May 2010. (4 Pages).

Li, J., et al. "Monolithic Integration of GAAS/INGAAS Laswers on Virtual GE Substrates Via Aspect-Ratio Trapping" Journal of the Electrochemical Society, vol. 156, No. 7. May 2009. pp. 574-578.

Park, H., et al. "Hybrid Silison Evanescent Laswer Fabricated With a Silicon Waveguide and III-V Offset Quantum Well" Optics Express, vol. 13, Issue 23. Nov. 2005. (6 Pages).

Tanabe, K., et al. "III-V/SI Hybrid Photonic Devices by Direct Fusion Bonding" Scientific Reports, vol. 2, Apr. 2012. (6 Pages).

\* cited by examiner

III-V LASERS WITH INTEGRATED SILICON PHOTONIC CIRCUITS

BACKGROUND

1. Technical Field

The present invention relates to photonic integrated circuits and, more particularly, to integrating III-V lasers with silicon-based photonic structures.

2. Description of the Related Art

Photonic integrated circuits (PICs) provide substantial benefits over conventional electronics. The use of photonics allows signals to propagate at the speed of light within the circuit, greatly increasing the potential speed of PIC devices. However, while structures for silicon-based PICs exist, silicon lacks the ability to generate light by itself.

To address this problem, III-V materials have been employed in conjunction with silicon by fusing a III-V light-emitting device to a silicon waveguide. This has been accomplished using a process called plasma-assisted wafer bonding, where the materials are exposed to an oxygen plasma before being pressed together. The direct growth of III-V materials on silicon generally results in crystal dislocations, defects which shorten the lifetime of the laser. However, discrete optical components will frequently be misaligned when fused together. Such misalignments between optical components introduce optical loss within PICs.

SUMMARY

A laser includes a three-layer semiconductor stack formed from III-V semiconductors on a substrate, wherein a middle layer has a lower bandgap than a top layer and a bottom layer; a mirror region monolithically formed at a first end of the stack, configured to reflect emitted light in the direction of the stack; and a waveguide region monolithically formed at a second end of the stack, configured to transmit emitted light.

A laser includes a plurality of three-layer semiconductor stacks formed from III-V semiconductors on a substrate, wherein a middle layer has a lower bandgap than a top layer and a bottom layer and wherein the stack has a height-to-width aspect ratio greater than 1; a mirror region monolithically formed at a first end of the stacks, configured to reflect emitted light in the direction of the stacks, said mirror region comprising alternating regions of first and second non-conductive materials having different indices of refraction; a waveguide region monolithically formed from a non-conductive material at a second end of the stacks, configured to transmit emitted light; a front contact that provides a shared electrical connection to the top layer of the stacks; and a back contact comprising a conductive layer in the substrate that provides a shared electrical connection to the bottom layer of the stacks.

A method for forming a laser includes etching a high-aspect ratio trench into an insulator layer on a substrate; depositing a three-layer semiconductor stack formed from III-V semiconductors on a substrate, wherein a middle layer has a lower bandgap than a top layer and a bottom layer; and monolithically forming a mirror region and a waveguide region in contact with respective ends of the stack.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
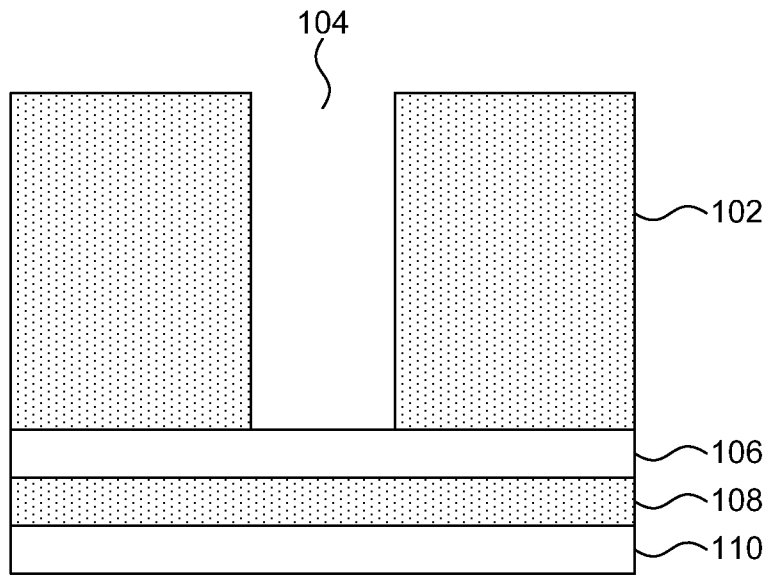
FIG. 1 is a cross-sectional view of a step in forming a III-V laser with integrated silicon photonic circuits in accordance with the present principles.

Embodiments of the present principles provide III-V lasers that may be readily integrated with silicon photonic integrated circuits (PICs). The present principles employ aspect ratio trapping (ART) to confine crystal defects when growing a monolithically integrated III-V/Si laser device.

In a laser diode, a p-type region may be formed with an n-type region. When a voltage is applied, charge carriers move from one end of the diode toward the other, including free electrons and "holes." When an electron meets a hole in an interface region, they may annihilate and produce a spontaneous emission. In other words, the electron assumes the energy state left open by the hole and emits energy having an energy that is the difference between the energy level of the free electron and of the hole. In a laser diode, this energy is released as light. Not all materials will produce light in these contexts—a "direct bandgap" material is needed. While common single-element semiconductors, such as silicon and germanium, do not produce the needed effect, composite semiconductors such as III-V materials do. These materials include multiple layers of elements from the III group and the V group of the periodic table, respectively. The transition between the layers of the different materials creates the direct bandgap property that allows for spontaneous emission.

The presence of spontaneous emissions may trigger additional, "stimulated" emissions by helping adjacent electrons and holes overcome a recombination energy. This produces an amplification effect, where a single photon can trigger multiple emissions. If there is more amplification than loss, the structure forms a laser and will continue to output light for as long as these conditions persist (e.g., as long as a voltage is applied).

The present embodiments deal specifically with edge-emitting lasers, though the present principles may be readily extended to other forms of laser. In an edge-emitting laser diode, a stack of semiconductor materials is used to generate coherent laser light. A layer of lower bandgap material is sandwiched between two layers of higher bandgap material. This structure is sometimes referred to as a double heterostructure laser, as the junction between each pair of layers is called a heterostructure.

The general double heterostructure structure can be used and extended to form specific varieties of laser, such as quantum well lasers, quantum cascade lasers, distributed feedback lasers, etc. Those having ordinary skill in the art will recognize that the present principles may be applied to such structures.

A challenge in forming heterostructure lasers is that the use of differing materials raises the potential for lattice mismatches. Particularly in the realm of III-V semiconductor lasers, which use composite semiconductor materials, lattice mismatches can cause defects at the heterostructure and which can propagate through the structure, decreasing the efficiency and lifetime of the laser.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cut-away diagram of an ART trench is shown. ART devices include arrays of tall dielectric trenches 102 with narrow openings 104 patterned on the substrate 106. In the present examples, the "aspect ratio" refers specifically to the ratio between the height of the tranches 102 and width of the opening 104. By selectively growing lattice-mismatched crystal on the substrate surface 106 within the ART trenches 104, crystal dislocations generated at the bottom of trenches 104 can be blocked from propagating upward, thereby providing high crystal quality in crystal films at the top portion of the ART trenches 104. To trap the crystal defects induced by lattice mismatch between epitaxial films and the substrate 106, the aspect ratio should be larger than 1. Exemplary aspect ratios may range from, e.g., about 2 to about 5. In this exemplary embodiment, the dielectric material is formed from, e.g., silicon dioxide and is on a silicon-on-insulator substrate formed from a semiconductor 106, a buried insulator 108 formed from, e.g., silicon dioxide, on a bulk silicon substrate 110. In one exemplary embodiment, the semiconductor layer 106 may be a doped or metallized conductive layer formed from silicon, germanium, or another appropriate semiconductor material.

Figure 2:
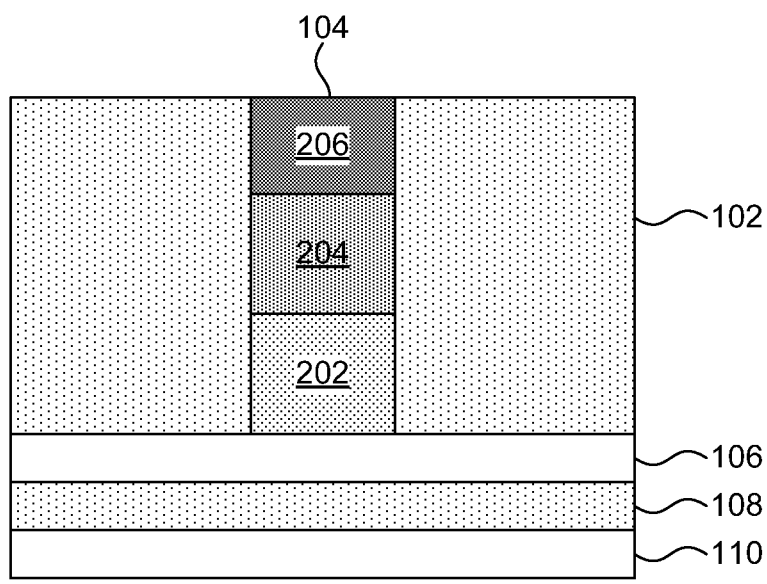
FIG. 2 is a cross-sectional view of a step in forming a III-V laser with integrated silicon photonic circuits in accordance with the present principles.

Referring now to FIG. 2, a cut-away view of a compound semiconductor formed in the ART trench 104 is shown. A first multi-layer of semiconductor 202 is formed on the silicon layer 106, a second multi-layer of semiconductor 204 is formed on top of the first semiconductor multi-layer 202, and a third multi-layer of semiconductor 206 is filled on top. The three semiconductor multi-layers 202, 204, and 206 are each III-V compound semiconductors formed from a composite of an element in the III-group of the periodic table and an element in the V-group. Such materials may include, e.g., boron, aluminum, gallium, or indium with nitrogen, phosphorous, arsenic, or antimony. The materials should be selected such that the multi-layers represented by second semiconductor 204 has the lowest III-V material bandgap compared to semiconductor multi-layers 202 and 206. A chemical-mechanical planarization (CMP) may be performed to planarize the top of the third semiconductor multi-layer 206 with the top of the dielectric material 102. It should be understood that, due to ART, crystal defects are confined to the bottom of the first semiconductor layer 202.

Ternary compositions, such as those used in the III-V semiconductor stacks 304 of the present embodiments, allow for adjustment of the band gap within the range of the individual compounds. For example, GaAs is limited to 850 nm, but Al(x)Ga(1−x)As with an increased Al content increases the bandgap energy and thus produces a shorter emission wavelength. Quaternary and higher order compositions allow for adjustment of the band gap and the lattice constant, allowing increased radiant efficiency at a higher range of wavelengths.

Figure 3:
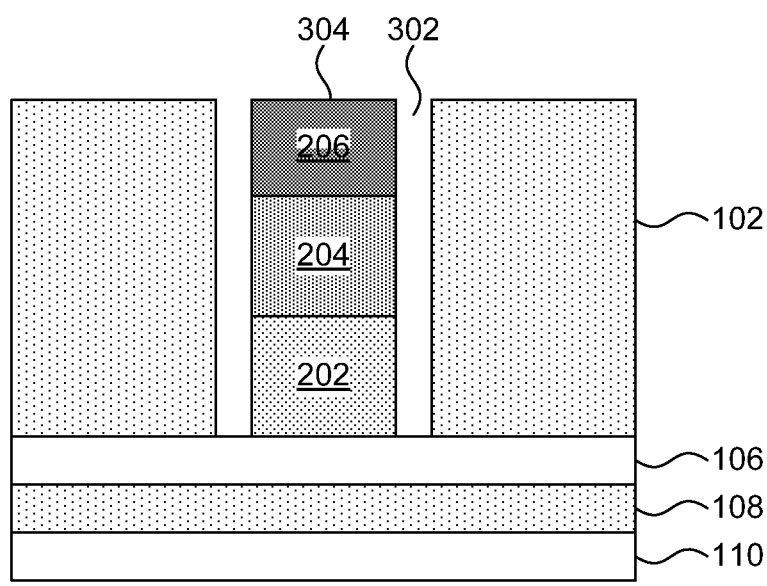
FIG. 3 is a cross-sectional view of a step in forming a III-V laser with integrated silicon photonic circuits in accordance with the present principles.

Referring now to FIG. 3, a lengthwise cut-away view of the ART trench 104 is shown. The ends of the trench 104 are etched to extend the trench around the semiconductor stack 304, producing gaps 302 that extend down to the semiconductor layer 106. The etch should be highly anisotropic to produce a strong ninety-degree joint between the exposed semiconductor layer 106 and the semiconductor stack 304. Exemplary etches may include reactive-ion etches (RIEs) including, e.g., $BCl_3/Cl_2$ and $CH_4/H_2$ etches.

Figure 4:
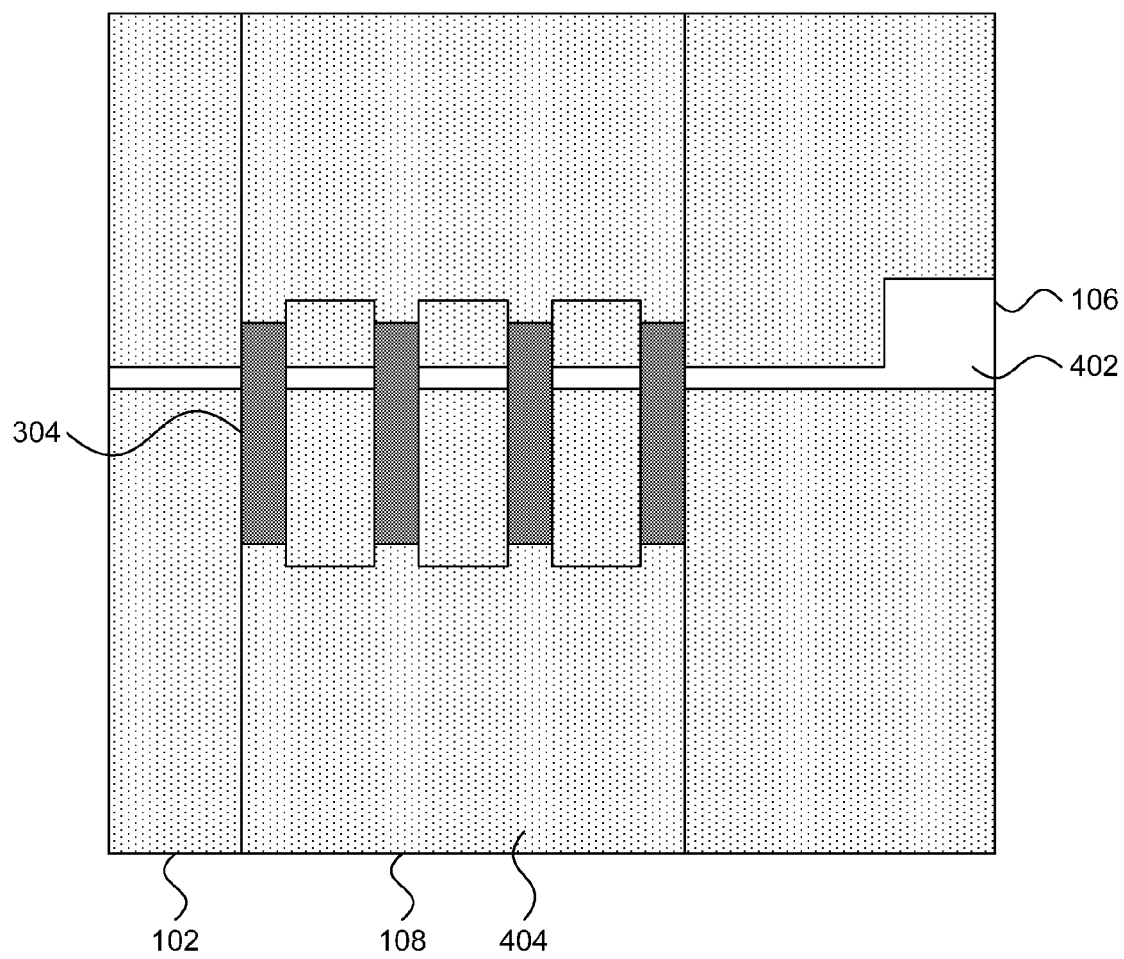
FIG. 4 is a top-down view of a step in forming a III-V laser with integrated silicon photonic circuits in accordance with the present principles.

Referring now to FIG. 4, a top-down view of several semiconductor stacks 304 is shown. A back contact region 402 is lithographically defined by etching away dielectric layer 102 down to the semiconductor layer 106. The dielectric layer is further lithographically etched away at either end of the stacks 304 to clear away waveguide regions 404. This etch removes material down to the buried dielectric layer 108, removing the semiconductor layer 106 in the waveguide regions 404.

Figure 5:
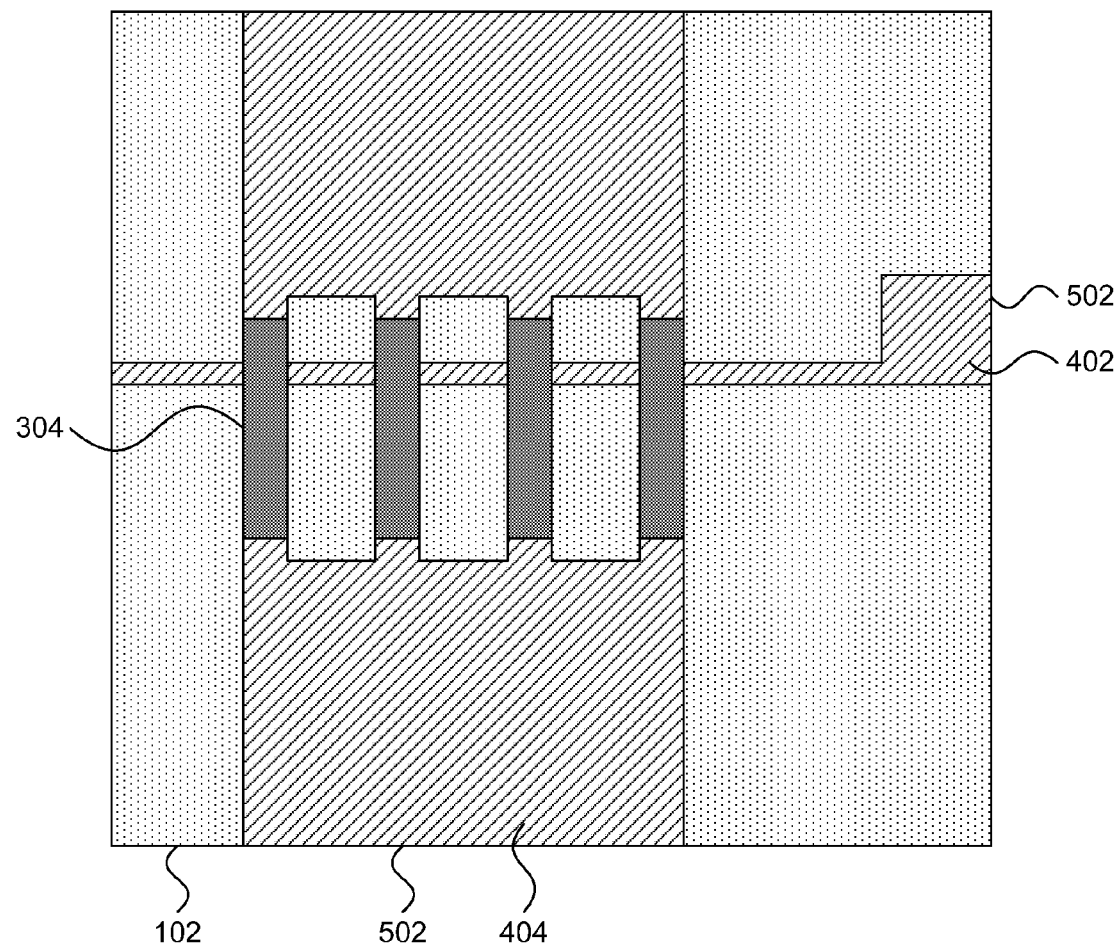
FIG. 5 is a top-down view of a step in forming a III-V laser with integrated silicon photonic circuits in accordance with the present principles.

Referring now to FIG. 5, a top-down view of the semiconductor stacks 304 is shown. The back contact region 402 and the waveguide regions are filled with a non-conductive waveguide material 502. The waveguide material can be, e.g., aluminum nitride, amorphous silicon, or amorphous III-V.

Figure 6:
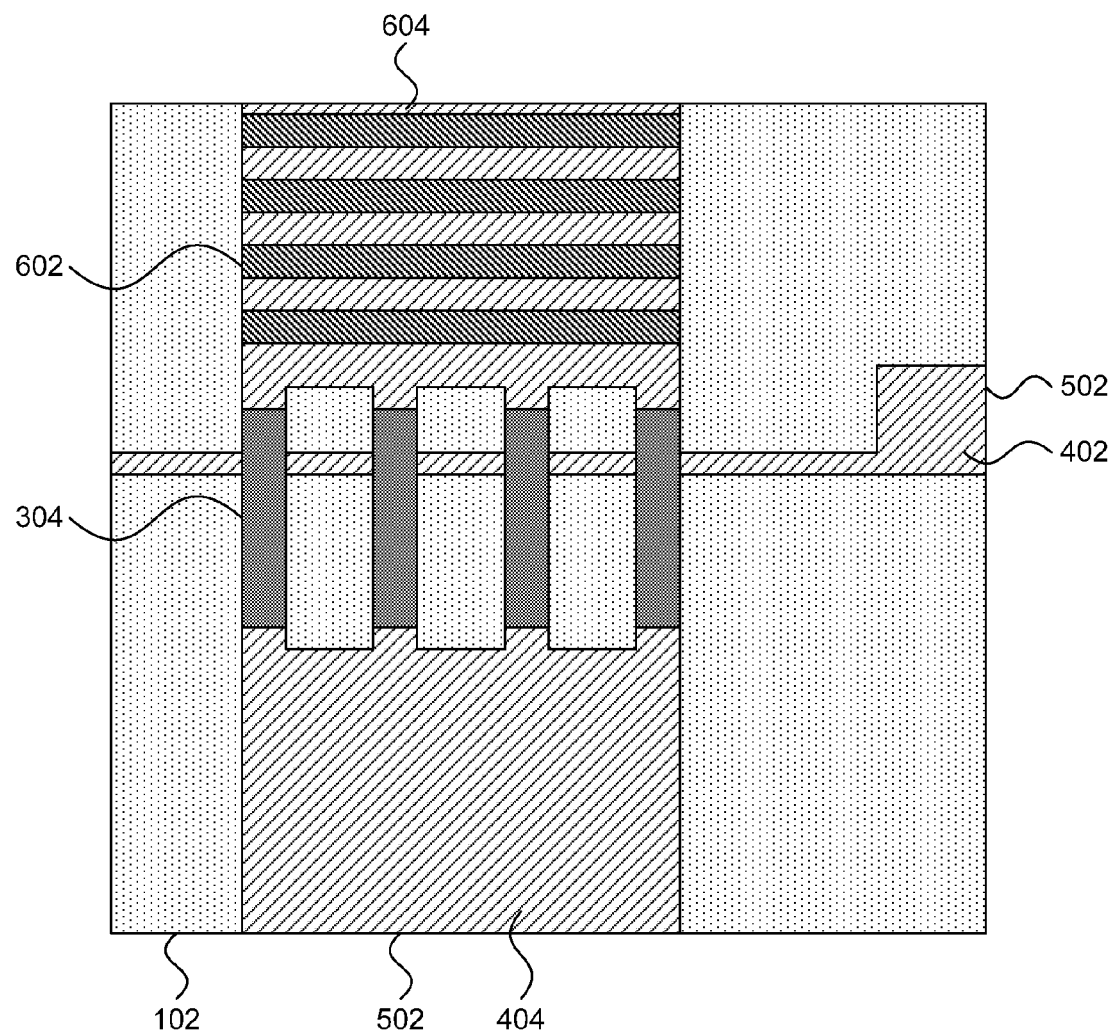
FIG. 6 is a top-down view of a step in forming a III-V laser with integrated silicon photonic circuits in accordance with the present principles.

Referring now to FIG. 6, a top-down view of the semiconductor stacks 304 is shown. One waveguide region 404 is patterned and etched to produce regularly spaced trenches. These trenches are filled with a second non-conductive material 602 that has a different refractive index from the first material 502. This establishes a mirror region 604. The separation of regions of second material 602 depends on the target wavelength of the laser and typically ranges from about 100 nm to about 1000 nm.

Figure 7:
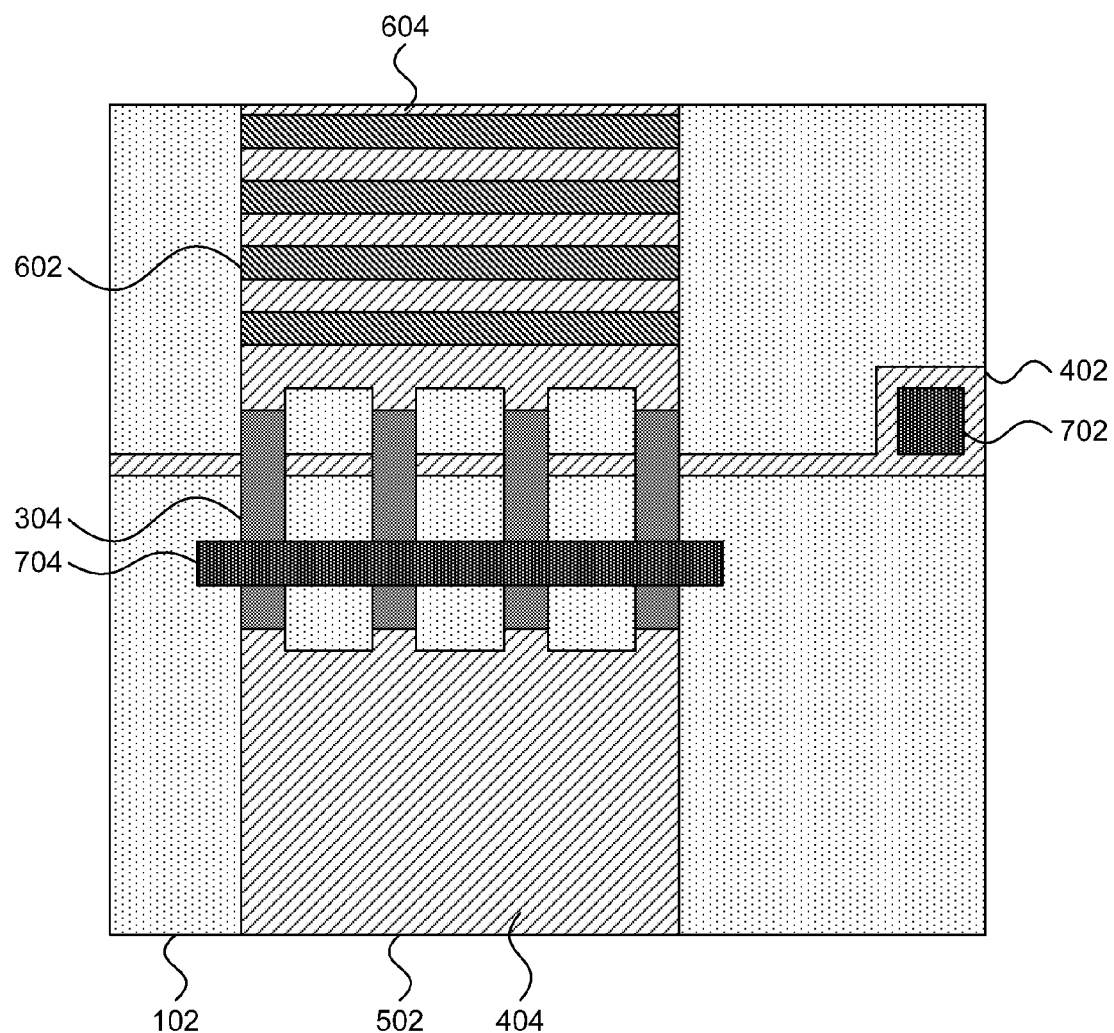
FIG. 7 is a top-down view of a step in forming a III-V laser with integrated silicon photonic circuits in accordance with the present principles.

Referring now to FIG. 7, a top-down view of the semiconductor stacks 304 is shown. An opening is etched into back contact region 402. A back contact 702 formed of multi-layers of metal is deposited in the etched portion and a front contact 704 is deposited across the semiconductor stacks 304. In this form, the completed laser emits light from the ends of the stacks 304. Light that is emitted in the direction of the mirror region 604 is reflected back and exits with the rest of the emitted light from the waveguide region 404. The waveguide region 404 may be formed in contact with other optical features, allowing for monolithic integration of laser-generating components with passive optical components.

The back contact 702 extends down to the semiconductor layer 106. As noted above, the semiconductor layer 106 may be a doped or metallized layer. Because each of the stacks 304 rests on the layer 106, that layer that provides conductive connections between the back contact 702 and the individual stacks 304.

Although the present embodiments are described in the specific context of an edge-emitting double heterostructure laser, they may be readily applied to other sorts of lasers, including distributed Bragg reflector and distributed feedback lasers, tunable lasers, small-ring lasers, etc.

Figure 8:
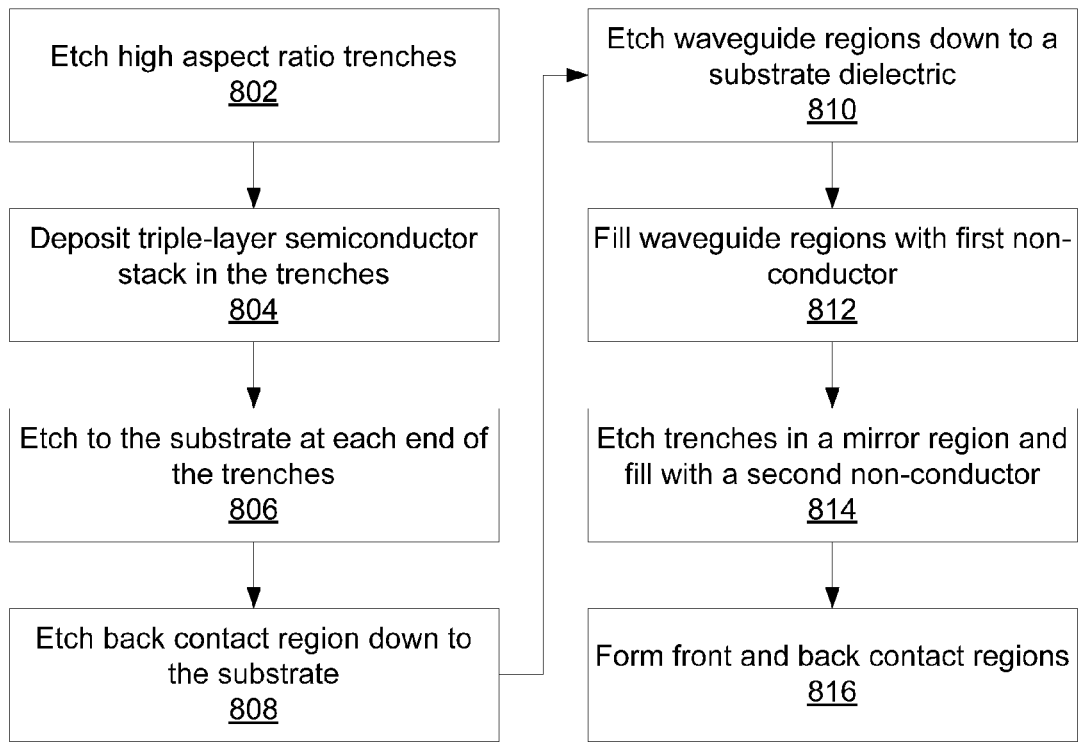
FIG. 8 is a block/flow diagram of a method of forming a III-V laser with integrated silicon photonic circuits in accordance with one illustrative embodiment.

Referring now to FIG. 8, a method for forming a III-V laser monolithically integrated with waveguides is shown. Block 802 etches high aspect ratio trenches 104 into an insulator layer 102 on a silicon-on-insulator substrate. Block 804 deposits a triple-layer semiconductor stack 304 formed from three III-V semiconductors 202, 204, and 206, where the middle layer 204 has a lower bandgap than the first and third layers 202 and 206.

Block 806 creates space at the ends of the semiconductor stacks 304 using an anisotropic etch to remove insulator material down to the semiconductor layer 106. Block 808 etches a back contact region connecting the stacks 304 and block 810 etches waveguide regions 404 starting at the previously-etched ends of the stacks 304. Although it is specifically contemplated that lithographic etching may be used for blocks 808 and 810.

Block 812 fills in the waveguide regions 404 with a first non-conductor material 502. Block 814 etches trenches in one waveguide region 404 and fills the trenches with a second non-conductive material 602, forming mirror region 604. Block 816 forms electrical contacts for the back contact 702 and the front contact 704.

Figure 9:
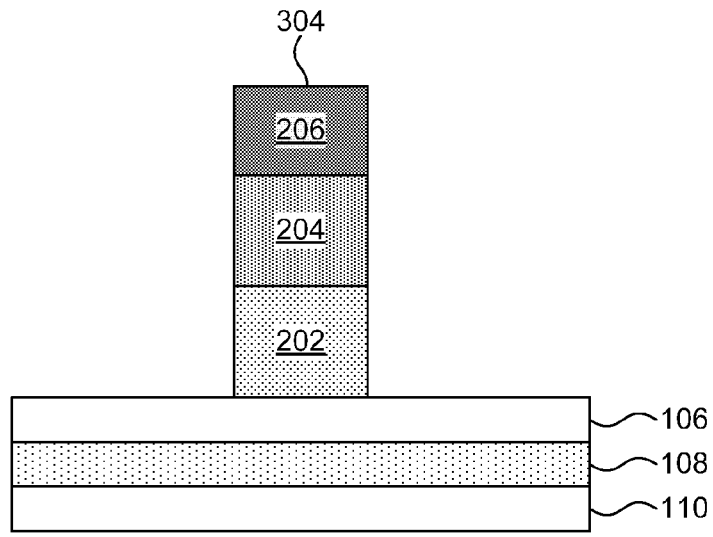
FIG. 9 is a cross-sectional view of a step in forming an alternative embodiment of a III-V laser with integrated silicon photonic circuits in accordance with the present principles.

Referring now to FIG. 9, a lengthwise cut-away view of the stack 304 is shown in an alternative embodiment. This embodiment is a departure after block 806. In this embodiment, the remaining dielectric material 102 is removed using, e.g., a wet etch or other appropriate etching process, leaving the semiconductor layer 106 exposed.

Figure 10:
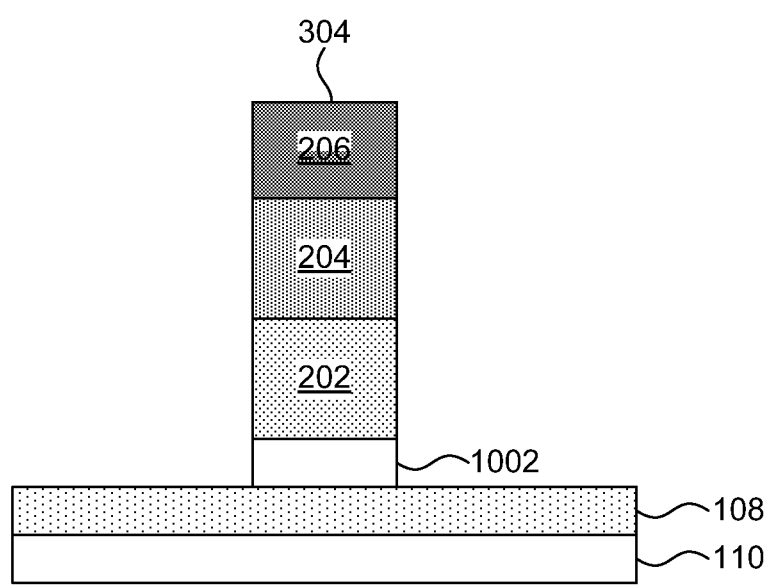
FIG. 10 is a cross-sectional view of a step in forming an alternative embodiment of a III-V laser with integrated silicon photonic circuits in accordance with the present principles.

Referring now to FIG. 10, a lengthwise cut-away view of the stack 304 is shown in an alternative embodiment. The semiconductor layer 106 around the stack 304 is selectively etched, leaving only the portion 1002 underneath the stack 304 and portions for the back contact.

Figure 11:
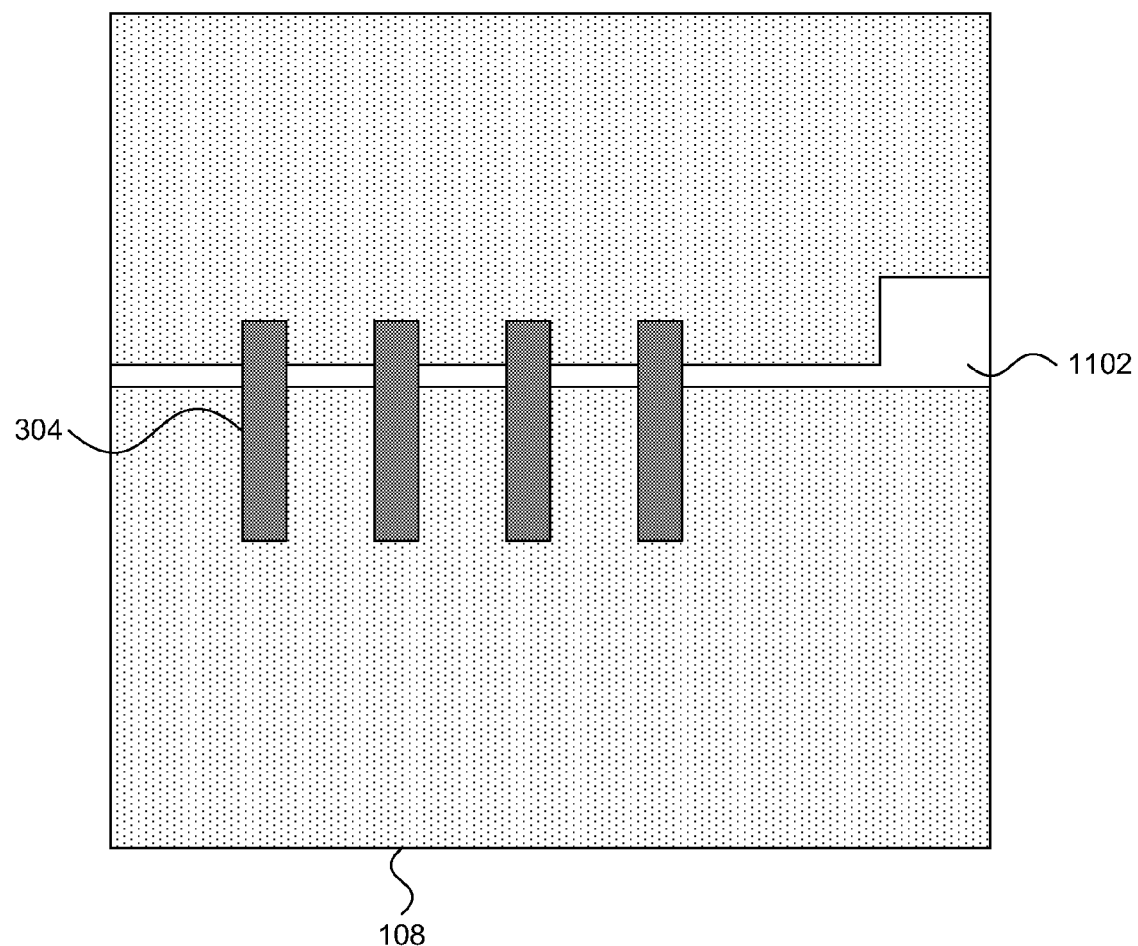
FIG. 11 is a top-down view of a step in forming an alternative embodiment of a III-V laser with integrated silicon photonic circuits in accordance with the present principles.

Referring now to FIG. 11, a top-down view of the semiconductor stacks 304 in an alternative embodiment is shown. The dielectric layer 108 is exposed except for those regions 1102 of semiconductor material remaining to form the back contact region. The remaining regions 1102 of semiconductor material electrically connect the stacks 304. From this point, the fabrication process resumes at block 812, with the waveguide regions being defined by, e.g., lithographic processes.

Having described preferred embodiments of a III-V laser with integrated silicon photonic circuits and methods of making the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a laser, comprising:
   etching a high-aspect ratio trench into an insulator layer on a substrate;
   depositing a three-layer semiconductor stack formed from III-V semiconductors on a substrate, wherein a middle layer has a lower bandgap than a top layer and a bottom layer;
   monolithically forming a mirror region and a waveguide region in contact with respective ends of the stack; and
   forming front and back contacts that contact the top and bottom of the stack, respectively.

2. The method of claim 1, wherein the stack has a height-to-width aspect ratio greater than 2.

3. The method of claim 1, wherein monolithically forming the mirror region and the waveguide region comprises etching the respective regions from the insulator and depositing a first non-conductive material.

4. The method of claim 3, wherein monolithically forming the mirror region further comprises etching trenches in the non-conductive material and depositing a second non-conductive material.

5. The method of claim 4, wherein alternating regions of the first and second non-conductive materials are separated on a wavelength of the emitted light.

6. The method of claim 1, wherein the back contact includes a conductive layer in the substrate that connects to the bottom layer of the stack.

7. The method of claim 6, wherein forming the back contact comprises:
   etching a vertical channel; and
   depositing a metal contact that contacts the conductive layer in the substrate and provides electrical access.

8. The method of claim 1, further comprising depositing a plurality of said three-layer semiconductor stacks.

9. The method of claim 1, wherein monolithically forming the waveguide region comprises:
   forming a surface perpendicular to the stack; and
   forming an extension from said surface that connects with the stack.

10. A method for forming a laser, comprising:
    etching a high-aspect ratio trench into an insulator layer on a substrate;
    depositing a three-layer semiconductor stack formed from III-V semiconductors on a substrate, wherein a middle layer has a lower bandgap than a top layer and a bottom layer; and
    monolithically forming a mirror region and a waveguide region in contact with respective ends of the stack, comprising:
      etching the respective regions from the insulator;
      depositing a first non-conductive material;
      etching trenches in the first non-conductive material; and
      depositing a second non-conductive material.

11. The method of claim 10, wherein alternating regions of the first and second non-conductive materials are separated on a wavelength of the emitted light.

12. The method of claim 10, wherein monolithically forming the waveguide region comprises:
    forming a surface perpendicular to the stack; and
    forming an extension from said surface that connects with the stack.

13. A method for forming a laser, comprising:
    etching a high-aspect ratio trench into an insulator layer on a substrate;
    depositing a three-layer semiconductor stack formed from III-V semiconductors on a substrate, wherein a middle layer has a lower bandgap than a top layer and a bottom layer; and
    monolithically forming a mirror region and a waveguide region in contact with respective ends of the stack, comprising:
      forming a surface perpendicular to the stack; and
      forming an extension from said surface that connects with the stack.

* * * * *